United States Patent
Huang et al.

(10) Patent No.: US 10,354,923 B2
(45) Date of Patent: Jul. 16, 2019

(54) SEMICONDUCTOR DEVICE AND METHOD FOR ATOMIC LAYER DEPOSITION OF A DIELECTRIC OVER A SUBSTRATE

(71) Applicant: Taiwan Semiconductor Manufacturing Company, Ltd., Hsinchu (TW)

(72) Inventors: Yen-Chun Huang, New Taipei (TW); Bang-Tai Tang, New Taipei (TW); Chih-Tang Peng, Zhubei (TW); Tai-Chun Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/610,266

(22) Filed: May 31, 2017

(65) Prior Publication Data
US 2018/0350693 A1    Dec. 6, 2018

(51) Int. Cl.
*H01L 21/8234* (2006.01)
*H01L 21/02* (2006.01)
*H01L 27/088* (2006.01)
*H01L 21/31* (2006.01)
*H01L 21/469* (2006.01)

(52) U.S. Cl.
CPC .. *H01L 21/823481* (2013.01); *H01L 21/0228* (2013.01); *H01L 21/02164* (2013.01); *H01L 21/02219* (2013.01); *H01L 21/02274* (2013.01); *H01L 21/02348* (2013.01); *H01L 21/823431* (2013.01); *H01L 27/088* (2013.01)

(58) Field of Classification Search
CPC ....... H01L 21/823481; H01L 21/02164; H01L 21/02211; H01L 21/0228; H01L 21/02348; H01L 21/823431; H01L 21/02274; H01L 21/0234; H01L 21/76837; H01L 21/02318; H01L 21/31608
USPC ..... 257/E21.24, E21.482, E21.497; 438/788, 438/791

See application file for complete search history.

(56) References Cited

U.S. PATENT DOCUMENTS

| | | | |
|---|---|---|---|
| 2009/0203227 A1* | 8/2009 | Hasebe | C23C 16/345 438/787 |
| 2010/0081094 A1* | 4/2010 | Hasebe | C23C 16/02 430/323 |
| 2012/0267340 A1* | 10/2012 | Kakimoto | C23C 16/045 216/37 |
| 2013/0210241 A1* | 8/2013 | LaVoie | H01L 21/02164 438/791 |
| 2013/0213301 A1* | 8/2013 | Hasebe | C23C 16/02 118/720 |
| 2015/0348966 A1* | 12/2015 | Zhao | H01L 27/0886 257/401 |
| 2016/0099143 A1* | 4/2016 | Yan | C23C 16/402 438/782 |

(Continued)

FOREIGN PATENT DOCUMENTS

KR    20090084737 A    8/2009

*Primary Examiner* — Nduka E Ojeh
(74) *Attorney, Agent, or Firm* — Slater Matsil, LLP

(57) ABSTRACT

A method includes performing an atomic layer deposition (ALD) process to deposit a dielectric material over a substrate, curing the deposited dielectric material using an ultra violet (UV) light, and annealing the deposited dielectric material after the curing.

20 Claims, 17 Drawing Sheets

(56) References Cited

U.S. PATENT DOCUMENTS

2018/0019113 A1\* 1/2018 Hasebe .................. C23C 16/02
2018/0122631 A1\* 5/2018 Xiao ................. H01L 21/02211

\* cited by examiner

US 10,354,923 B2

SEMICONDUCTOR DEVICE AND METHOD FOR ATOMIC LAYER DEPOSITION OF A DIELECTRIC OVER A SUBSTRATE

TECHNICAL FIELD

The present invention relates generally to semiconductor device fabrication, and, in particular embodiments, to formation of a dielectric layer using an atomic layer deposition (ALD) process in openings with high aspect ratio.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As transistor sizes decrease, the size of each feature decreases. One such feature is the shallow trench isolation (STI) used between active areas to isolate one semiconductor device from another and another is the inter-layer dielectric (ILD) between gate structures. Feature size reduction often results in increased aspect ratios because the widths of the openings are smaller but the depths may be the same as before. Techniques used to fill openings (e.g. STIs in substrates or ILDs between gate structures) having lower aspect ratios may provide poor filling results for openings of advanced technologies having high aspect ratios, such as aspect ratios of 8:1 or more.

Flowable chemical vapor deposition (FCVD) process improves the filling results by using flowable dielectric materials. Flowable dielectric materials, as their name suggest, can flow to fill voids in a gap. Usually, various chemistries are added to the silicon-containing precursors to allow the deposited film to flow. After the flowable film is deposited, it is cured and then annealed to remove the added chemistry to form dielectric layer, e.g., silicon oxide. The flowable film is usually cured and annealed at a high temperature, e.g., greater than 600° C. or greater than 1000° C., to obtain desired mechanical property. However, such a high temperature may not be allowed by the thermal budget of the semiconductor device. When cured at lower temperatures (e.g., between 300° C. and 700° C.), mechanical properties, such as the wet etch rate (WER), of the flowable film degrades (e.g., having increased WER), which may adversely affect subsequent processing. There is a need in the art for low-temperature deposition methods that could fill high aspect ratio openings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
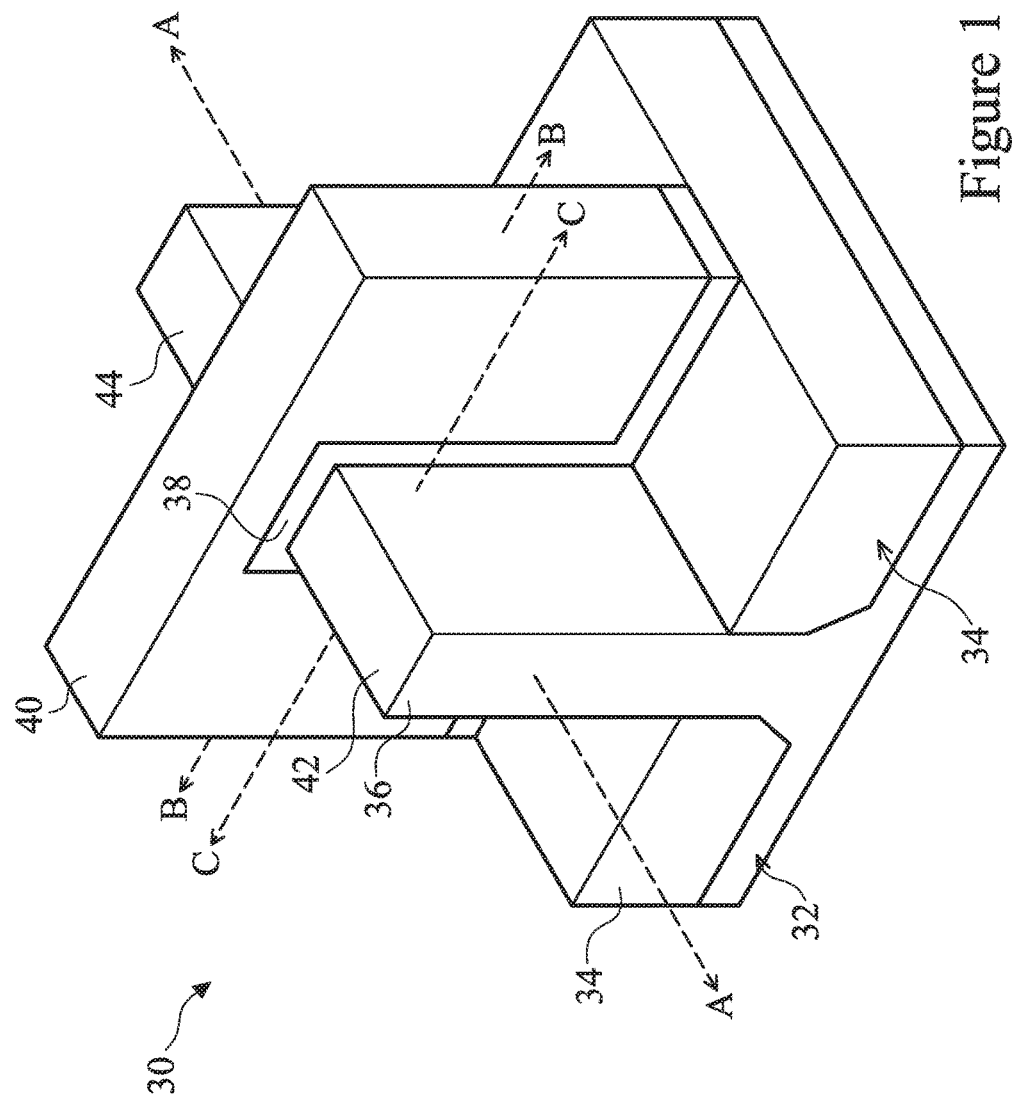
FIG. 1 is a three-dimensional view of a Fin Field-Effect Transistor (FinFET)

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are described in a specific context, and in particular, in the formation of an oxide layer in the STI regions of Fin Field-Effect Transistors (FinFETs). These embodiments are non-limiting examples. One skilled in the art will appreciate that the method disclosed in the present disclosure may be used to form other materials or layers (e.g., ILD), and/or applied in the fabrication of other semiconductor devices (e.g., planar transistors).

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section B-B is across a channel, gate dielectric 38, and gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-4B, 5A, 6A, 7A, 8A, and 9-14 are cross-sectional views of a FinFET 100 at various stages of fabrication in accordance with some embodiments. The FinFET 100 is similar to the FinFET 30 in FIG. 1, except for multiple fins.

Figure 12:
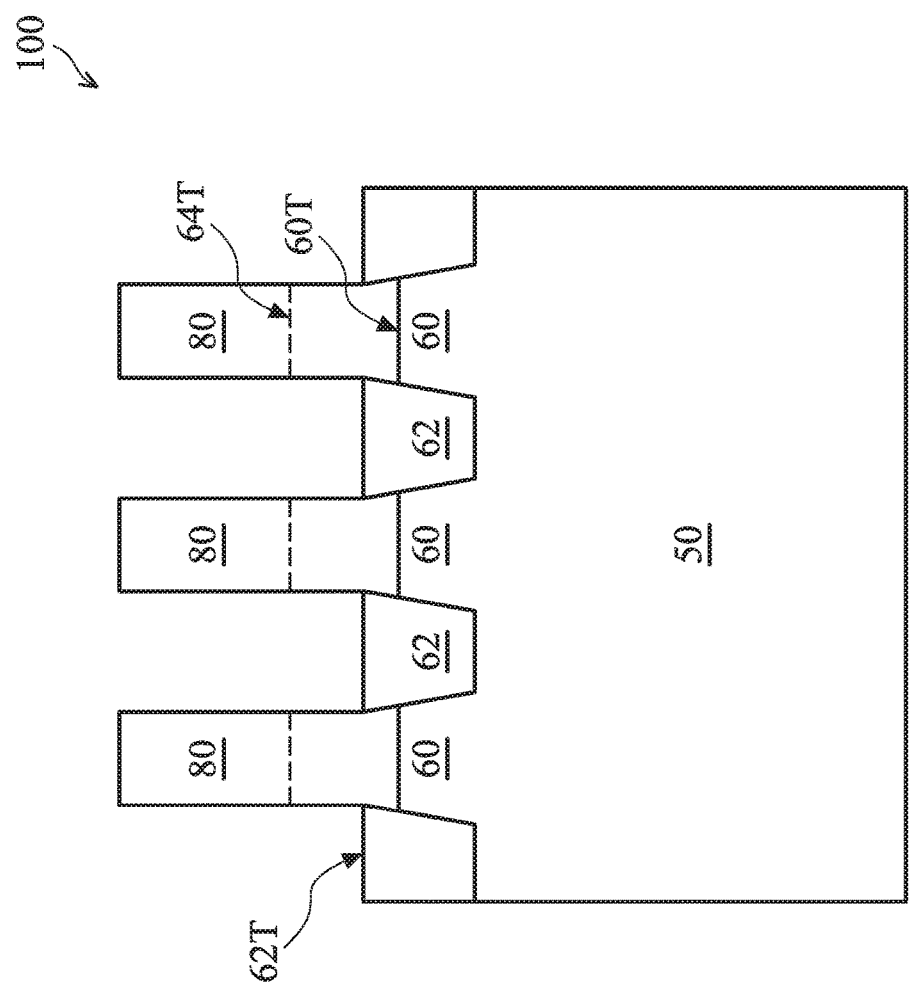
Figure 13:
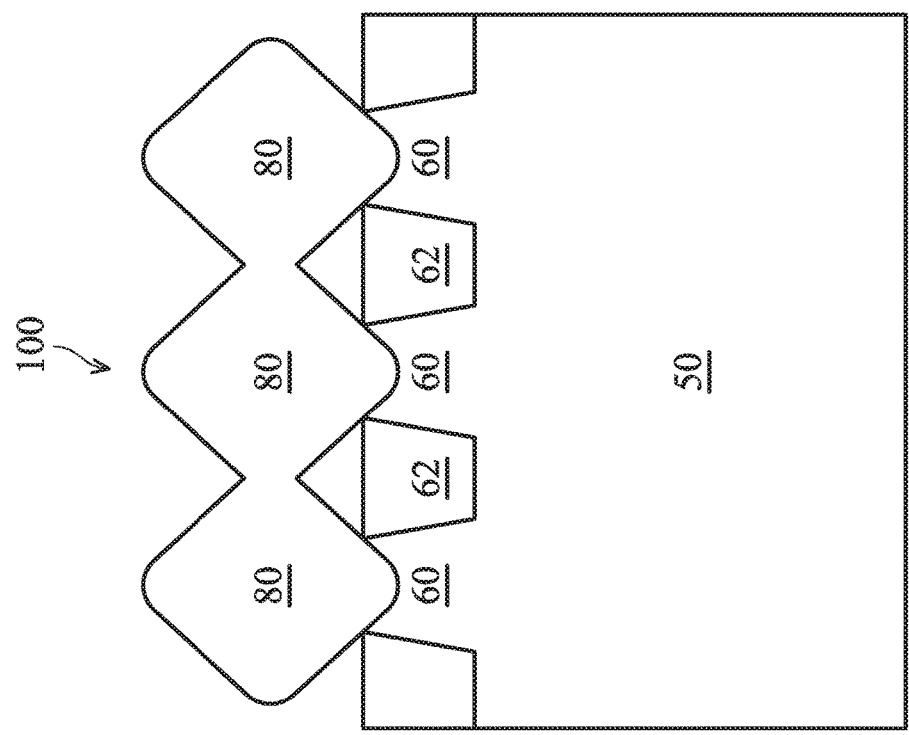
Figure 14:
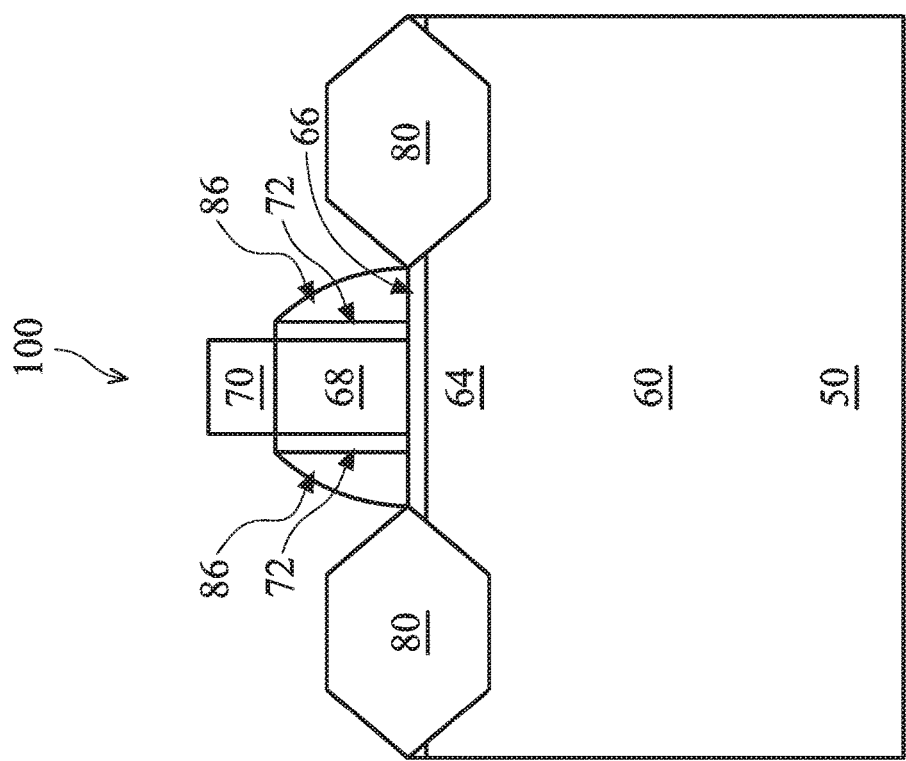
Figure 15:
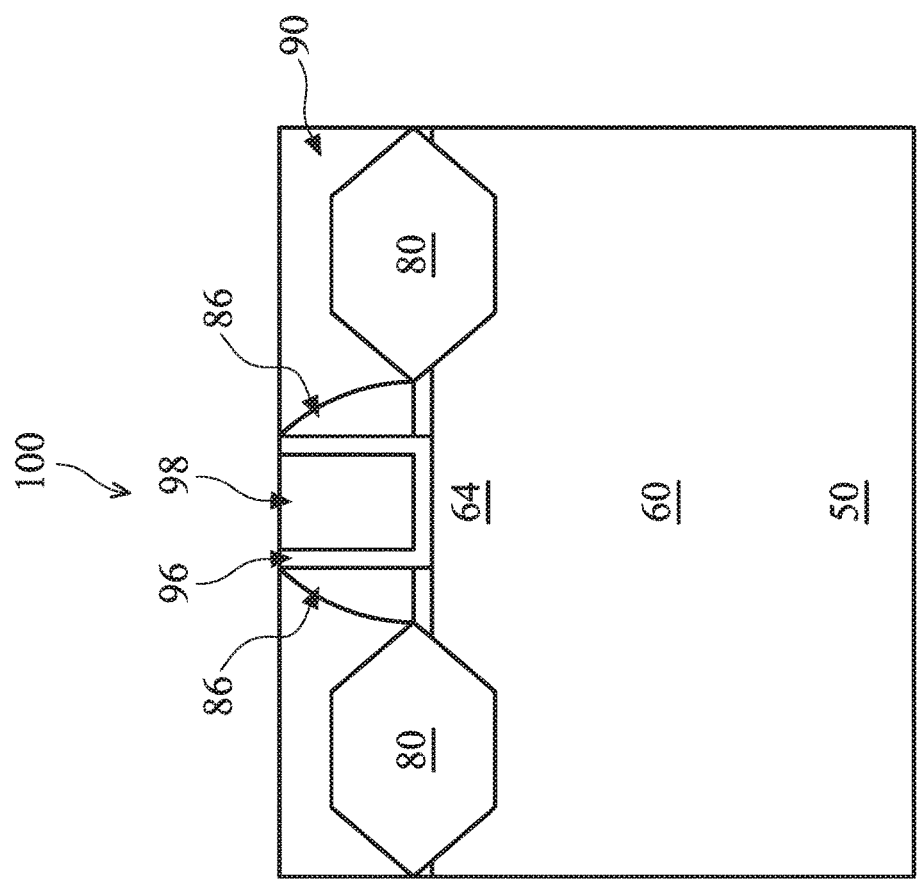

FIGS. 2-3, 4A, 5A, 6A, 7A, and 8-11 illustrate cross-section views of FinFET 100 along line B-B. FIGS. 12 and 13 illustrate cross-section views along line C-C and FIGS. 14-15 illustrate cross-section views along line A-A.

Figure 2:
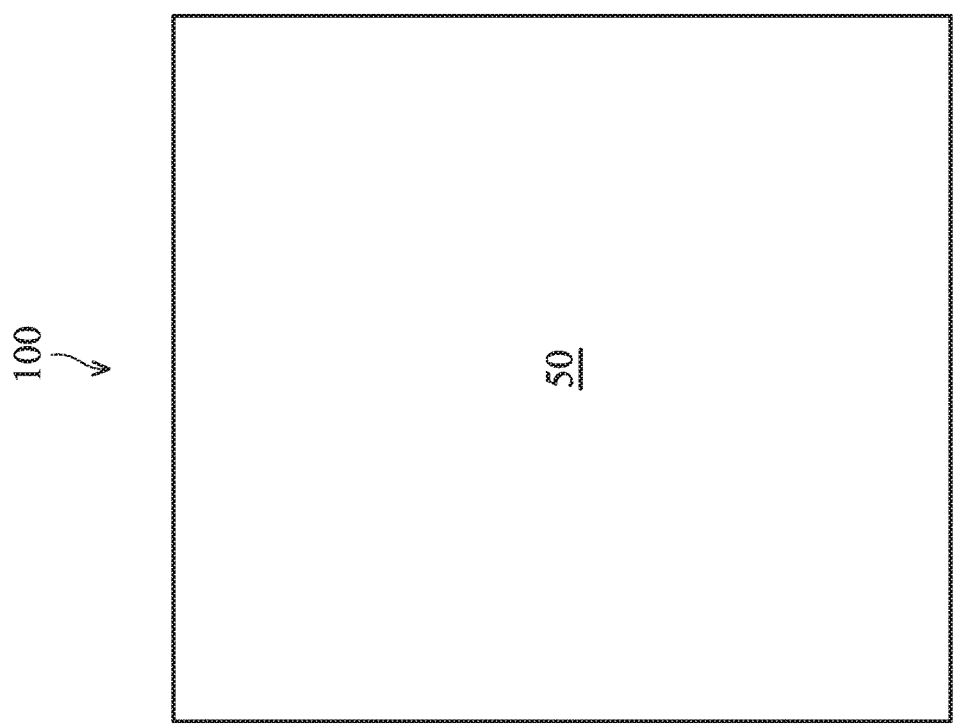
FIGS. 2, 3, 4A, 5A, 6A, 7A, and 8-16 are cross-sectional views of a FinFET at various stages of fabrication, in some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

Figure 3:
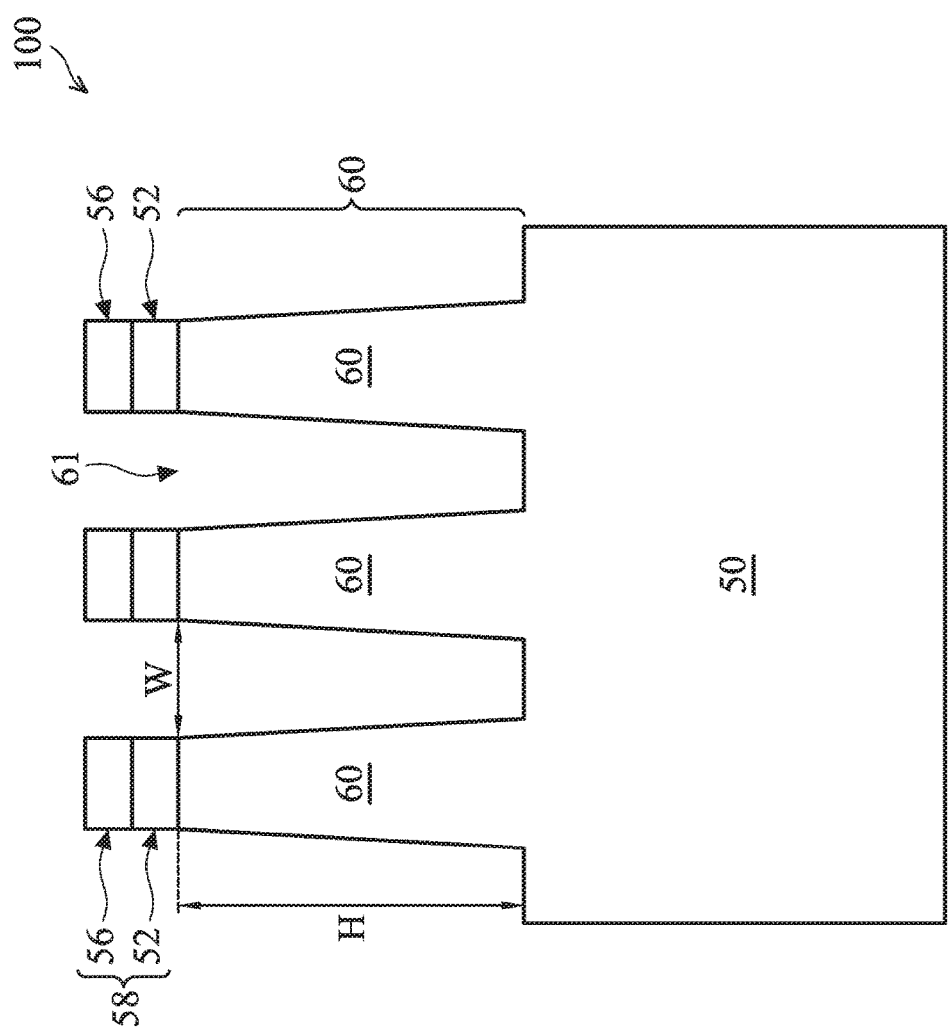

Referring to FIG. 3, the substrate 50 shown in FIG. 2 is patterned using, for example, photolithography techniques. For example, a mask layer, such as a pad oxide layer 52 and an overlying pad nitride layer 56, is formed over the substrate 50. The pad oxides layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50. The etching may be any acceptable etch process, such as a reactive ion etch (RIE), neutral beam etch (NBE), the like, or a combination thereof. The etch may be anisotropic. As will be discussed below, the trenches 61 will be subsequently filled with a dielectric material (e.g., silicon oxide), forming isolation regions such as shallow trench isolation (STI) regions adjacent the semiconductor strips 60.

In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask layer 58 may be removed by etching or any suitable method.

As will be discussed in more details hereinafter, an insulation material 63 (see FIG. 8) is formed in trenches 61, and will be recessed subsequently to form STI regions 62 (see FIG. 10). The upper portions of the semiconductor strips 60 protruding from between neighboring isolation regions 62 are referred to as semiconductor fins or fins, in the present disclosure.

In advanced semiconductor process technology, the trenches 61 may have a width W less than 10 nm and an aspect ratio (ratio of the depth H to the width W) larger than 20. Filling trenches or gaps with such high aspect ratios may be a challenge for methods such as spin-on process or FCVD. For example, if a spin-on process or an FCVD process is used to fill the trenches 61, a high temperature (e.g., higher than 600° C.) anneal process may be needed to convert the deposited flowable dielectric into an oxide (e.g., silicon oxide) and to obtain desired physical properties (e.g., WER, and/or hardness) for the oxide.

However, the high temperature anneal process required by the spin-on process or the FCVD process may cause problems such as loss of critical dimension (CD) and/or fin bending. The CD loss and fin bending may result from the non-uniform distribution of the deposited dielectric material (e.g., flowable dielectric material) and the high shrinkage factor of the deposited dielectric material at high temperature (e.g., higher than 600° C.). For example, due to the specific design of the semiconductor device, a small amount (e.g., volume) of dielectric material may be deposited on a first side of a semiconductor fin, and a large amount of dielectric material may be deposited on a second side of the fin opposing the first side. When the deposited dielectric material is annealed at high temperature, it will exert different amount of stress on the first side and the second side of the fin, due to the different volumes of the dielectric material on the first side and the second side of the fin. The imbalance of the stress, exacerbated by the high shrinkage factor of the dielectric material at high temperature, may cause the fin to bend. Fin bending may damage the fin, causing performance degradation or failure of the fabricated semiconductor device. The imbalance of stress may also cause the locations of the features of the semiconductor device, e.g., the fins, to shift, thus changing the dimension of the features and causing loss of the CD. As will be described in more details hereinafter, an ALD deposition process, followed by an ultra violet (UV) light curing process and a thermal anneal process (e.g., steam anneal process), all performed at low temperatures (e.g., lower than 450° C.), fill gaps having high aspect ratios while avoiding or reducing the CD loss and fin bending problem.

Figure 6B:
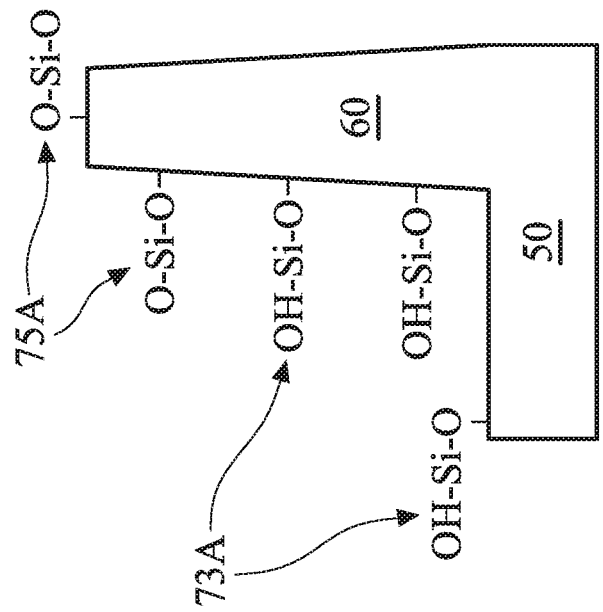
Figure 6A:
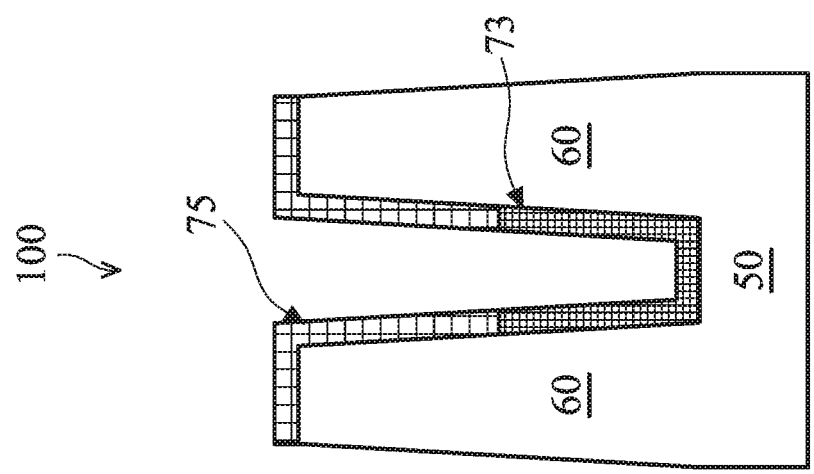
Figure 7B:
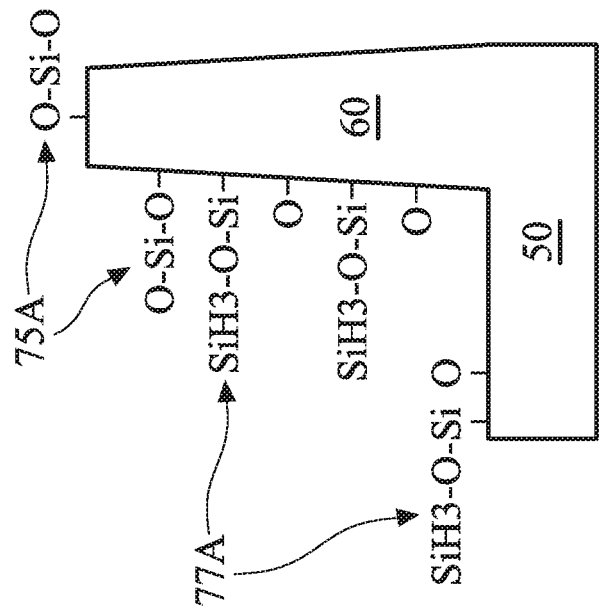
Figure 7A:
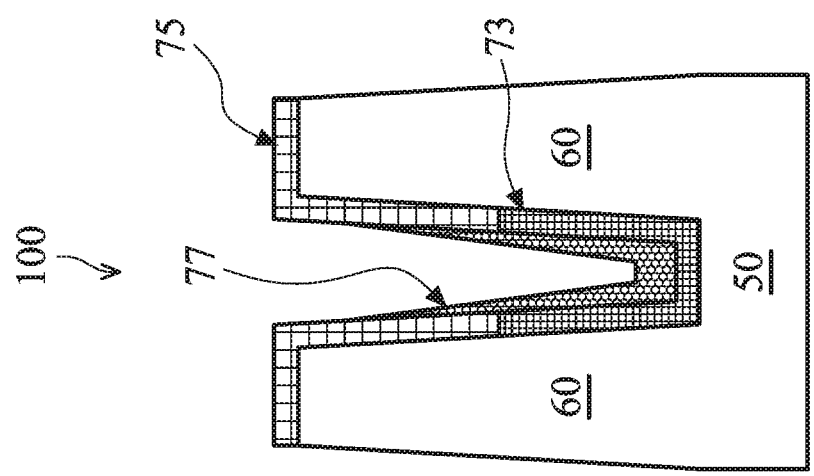
Figure 8:
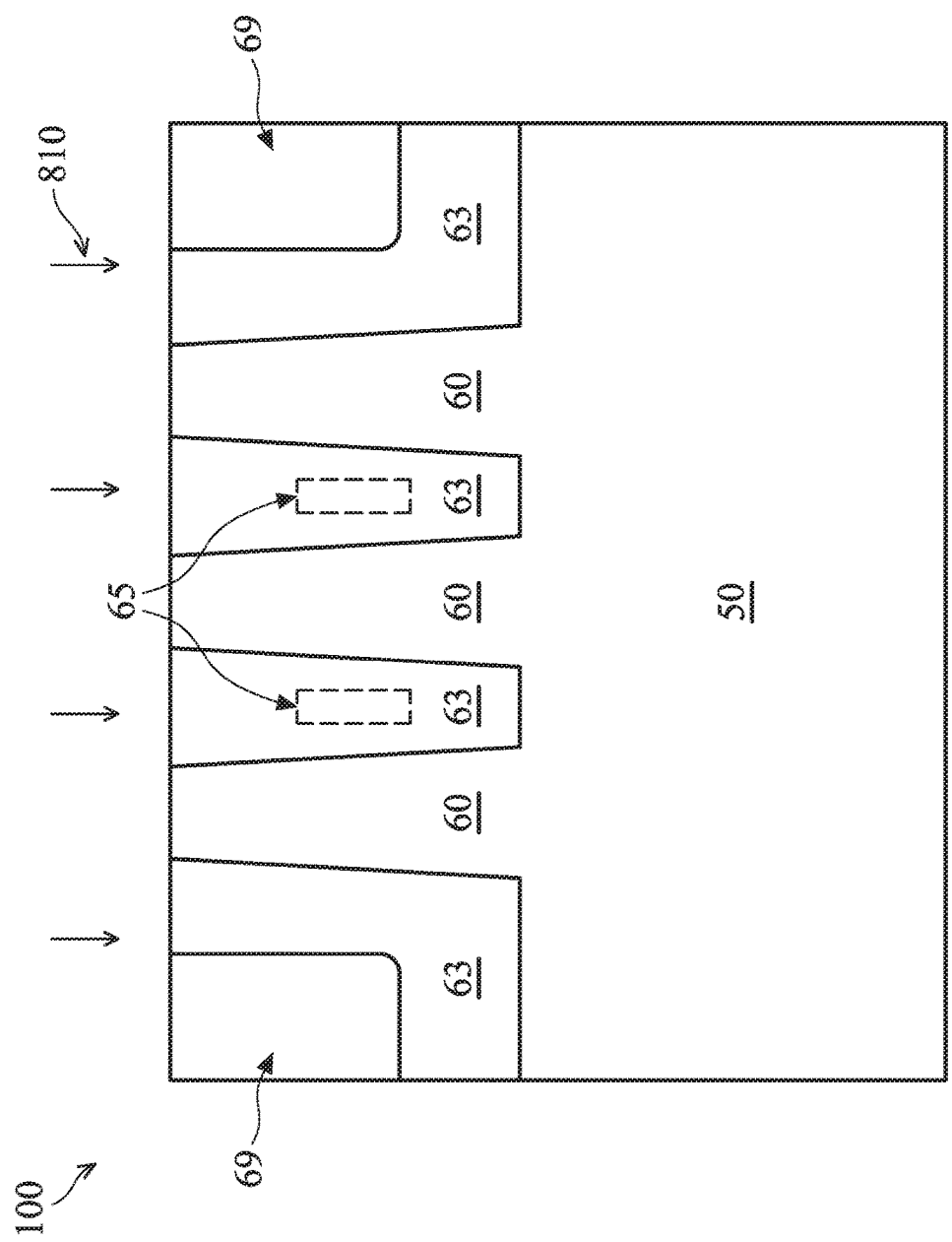

FIGS. 4A-7B illustrate an ALD process for forming an insulation material 63 (see label in FIG. 8). FIGS. 4A, 5A, 6A and 7A illustrate the cross-sectional views of the FinFET 100 during the formation process of the insulation material 63. For clarity, only two semiconductor strips 60 are illustrated in FIGS. 4A, 5A, 6A and 7A. FIGS. 4B, 5B, 6B and 7B correspond to FIGS. 4A, 5A, 6A and 7A, respectively, and illustrate the chemical bonds formed during the formation process of the insulation material 63. For simplicity, only one semiconductor strip 60 (e.g., the semiconductor strip 60 on the right side of FIGS. 4A, 5A, 6A and 7A) is illustrated in FIGS. 4B, 5B, 6B and 7B.

Figure 4B:
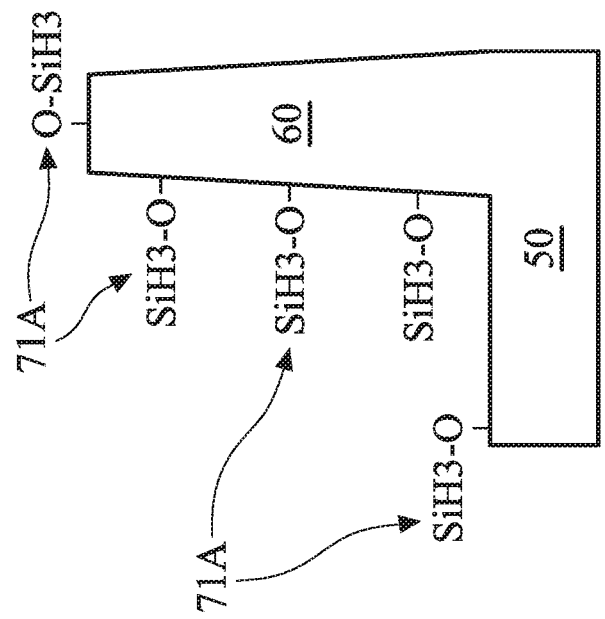
FIGS. 4B, 5B, 6B, and 7B illustrate the chemical bonds of the insulation material illustrated in FIGS. 4A, 5A, 6A, and 7A, respectively, in some embodiments.
Figure 4A:
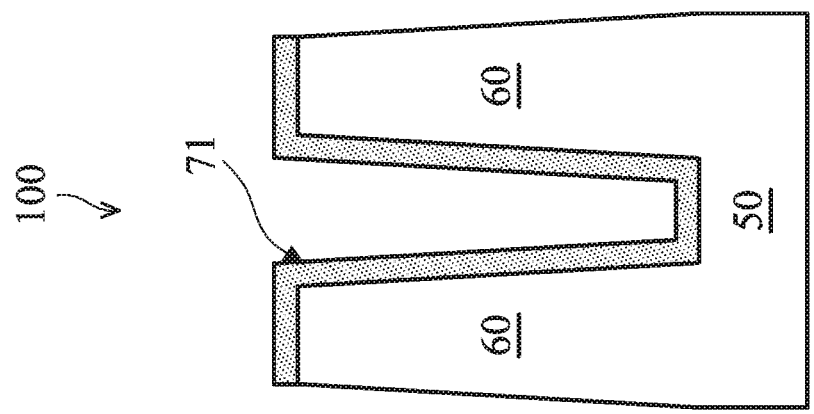

Referring to FIG. 4A, the FinFET 100 is disposed in a deposition chamber (not shown), and an ALD process is performed to deposit an insulation material 71 over the FinFET 100. In some embodiments, the ALD process is performed using $SiH_3N(C_3H_7)_2$ (also referred to as LTO520) as a precursor. The precursor LTO520 is supplied to the deposition chamber with $O_3$, in some embodiments. The precursor LTO520 may be in a gaseous state, and the $O_3$ may be in a plasma state. In an exemplary embodiment, the ALD process is performed with a flow rate for LTO520 between 50 standard cubic centimeter per minute (sccm) and 100 sccm, such as 75 sccm, a flow rate for $O_3$ between about 4000 sccm and 8000 sccm, such as 6000 sccm, a pressure between about 1.5 torr and about 2.2 torr, such as 1.6 torr, and a temperature between about 350° C. and about 450° C., such as 400° C. The deposition time may be adjusted based on a target thickness of the deposited insulating material. For example, an ALD process time of about 20 minutes to about 60 minutes may be used to deposit about 200 angstroms of the insulation material 71. In some embodiments, the ALD process include multiple deposition cycles, with each deposition cycle depositing about 0.4 angstrom to about 1 angstrom of the insulation material 71.

In some embodiments, the semiconductor strips 60 and the substrate 50 comprise silicon, and the LTO520 introduced into the deposition chamber adsorbs onto the surface of the semiconductor strips 60 and the substrate 50 to form O—$SiH_3N(C_3H_7)_2$ bonds. In addition, O—Si—O—H bonds are formed at the surfaces of the semiconductor strip 60 and the substrate 50 due to chemical reactions with the $O_3$ (e.g., $O_3$ plasma). In some embodiments, the LTO520 tends to react with the O—Si—O—H bonds at the surfaces of the semiconductor strips 60 and the substrate 50 to form O—Si—O—$SiH_3$ bonds through chemisorption. The adsorption and/or the chemisorption of the LTO520 form a layer of insulation material 71, as illustrated in FIG. 4A. The formula for the chemisorption of LTO520 is given below in equation (1):

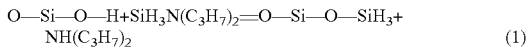

FIG. 4B illustrates the O—Si—O—$SiH_3$ bonds 71A of the insulation material 71.

Figure 5B:
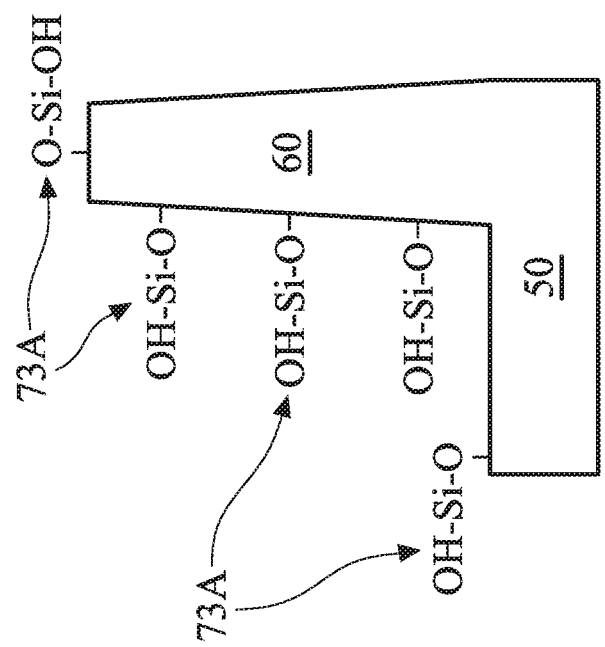
Figure 5A:
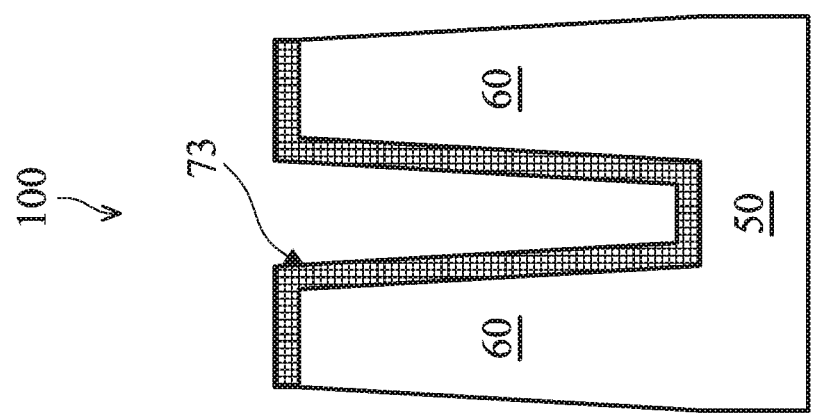

Referring to FIG. 5A, the $O_3$, which may be introduced into the deposition chamber at the same time with the LTO520, oxidizes the LTO520 and the insulation material 71. In some embodiments, the $O_3$ acts as an oxidant and reacts with (e.g., oxidizes) the O—$SiH_3$ bonds and/or the O—$SiH_3N(C_3H_7)_2$ bonds to form O—Si—OH bonds, thereby turning the layer of insulation material 71 into an insulation material 73. FIG. 5B illustrates the O—Si—OH bonds 73A of the insulation material 73. Note that although FIG. 4A and FIG. 5A illustrate the formation of the insulation material 71 and the oxidization of the insulation material 71 (into insulation material 73) in two separate steps, the formation of the insulation material 71 and the oxidization of the insulation material 71 may happen at the same time in the deposition chamber, since LTO520 and $O_3$ may be introduced into the deposition chamber together as a mixture of LTO520 and $O_3$.

Next, the gas inside the deposition chamber, which may include unreacted LTO520, $O_3$, and byproduct(s) of the chemical reactions, is evacuated (e.g., pumped) out of the deposition chamber. In some embodiments, a pressure inside the deposition chamber is between about 1.5 torr to about 2.2 torr after the evacuation of the gas.

Next, after the evacuation of the gas, the insulation material 73 is treated by a plasma process, as illustrated in FIG. 6A. In some embodiments, the plasma process is performed by introducing an $O_2$ plasma into the deposition chamber. In an exemplary embodiment, the plasma process is performed with a flow rate of $O_2$ plasma between about 50 sccm to about 100 sccm, such as 75 sccm, a pressure of 1.5 torr to about 2.2 torr, such as 1.6 torr, and a temperature between about 350° C. and about 450° C., such as 400° C. The $O_2$ plasma reacts with O—Si—OH bonds of the insulation material 73 near tops surface (e.g., surfaces proximate the upper surfaces of semiconductor strips 60 distal the substrate 50) of the semiconductor strips 60, and forms O—Si—O bonds near the top surfaces of semiconductor strips 60, thereby turning top portions of the insulation material 73 into insulation material 75 (e.g., silicon oxide). FIG. 6B illustrates the O—Si—O bonds 75A of the insulation material 75 and the O—Si—OH bonds 73A of the insulation material 73. The O—Si—O bonds of the insulation material 75 may retard LTO520 adsorption/chemisorption in subsequent ALD cycles. The insulation material 75 and the insulation material 73 may be collectively referred to as a first layer of the insulation material 63 formed by a first deposition cycle of the ALD process. Although not shown, an evacuation process may be performed after the $O_2$ plasma process to pump out gas inside the deposition chamber, before the second deposition cycle of the ALD process.

FIGS. 4A-6B illustrate a deposition cycle of the ALD process. In some embodiments, the ALD process involves performing multiple deposition cycles, with each deposition cycle repeating the processing illustrated in FIGS. 4A-6B and forming an additional layer of insulation material (e.g., a second layer of the insulation material 63, a third layer of the insulation material 63, etc.), until a target thickness for the insulation material 63 is achieved or trenches 61 are filled with the insulation material 63.

FIG. 7A illustrates the start of a second deposition cycle of the ALD process where a second layer of insulation material 77, similar to the insulation material 71 in FIG. 4A, is formed. Note that due to the O—Si—O bonds proximate the upper surfaces of the semiconductor strips 60, adsorption/chemisorption of LTO520 is retarded, therefore the insulation material 77 is formed over the first layer of the insulation material 63 along sidewalls and the bottom of the trenches 61. A thickness of the insulation material 77, measured along the direction of W (see FIG. 3), increases along a direction from the upper surfaces of the semiconductor strips 60 distal the substrate 50 to the substrate 50. For example, a first thickness of the insulation material 77 proximate the upper surfaces of the semiconductor strip 60 is smaller than a second thickness of the insulation material 77 proximate the bottom of the trenches 61. In the illustrated example, upper surfaces of the insulation material 77 form a V-shape.

FIG. 8 illustrates the FinFET 100 after the ALD process finishes. As illustrated in FIG. 8, an insulation material 63, which may include multiple layers of insulation materials with O—Si—O bonds and O—Si—OH bonds, fills the trenches 61. Note that ALD process is a conformal deposition process, thus for areas having wide openings (e.g., openings with width larger than 0.1 μm), the ALD process may not completely fill the wide openings, in which case conventional deposition process such as physical vapor deposition (PVD) or chemical vapor deposition (CVD) may be used to fill portions of the wide openings that are not filled by the ALD process. For example, FIG. 8 shows an insulation material 69 filling a portion of a recess that is not filled by the insulation material 63 formed by the ALD process. The insulation material 69 may be an oxide, such as silicon oxide, a nitride, the like, or a combination thereof, and may be formed by CVD, PVD, or other suitable formation methods. In some embodiments, the ALD process completely fills all openings, and insulation material 69 is omitted. For simplicity, the insulation material 69 is not illustrated in subsequent processing.

Further in FIG. 8, a planarization process, such as a chemical mechanical polish (CMP), may remove any excess insulation material 63, such that the top surface of the insulation material 63 and top surfaces of the semiconductor strips 60 are coplanar.

Still referring to FIG. 8, an UV curing process 810 is performed after the ALD process to cure the deposited insulation material 63. The UV curing process 810 may be performed in the deposition chamber, or alternatively, in a different chamber than the deposition chamber. In some embodiments, the UV curing process 810 is performed using an UV light with a wavelength between about 200 nm to about 400 nm. For example, a commercial H+ bulb may be used as the UV light source. A time interval for the UV curing process may be between about 1 minute and about 4 minutes, although other values are also possible. A temperature of the UV curing process is between about 10° C. to about 450° C., in some embodiments. The UV curing process converts non-converted bonds (e.g., O—SiH3 bonds) into O—Si-dangling bonds, thus improving the physical properties (e.g., WER, and/or hardness) of the insulation material 63, in some embodiments.

Without the UV curing process 810, regions 65 of the insulation material 63 (e.g., center regions between adjacent semiconductor strips 60) may have weaker physical properties (e.g., faster WER, and/or softer) than other regions of the insulation material, due to, e.g., non-converted precursor adsorption at surfaces of the layers of insulation material formed during final deposition cycles of the ALD process. These weak regions 65, if left unaddressed, may adversely affect the subsequent processing of the FinFET (e.g., resulting in fin height loss). With the UV curing process, the non-converted bonds in the regions 65 of the insulation material 63 are converted to O—Si—O bonds, thus avoiding or reducing the problems discussed above.

Figure 9:
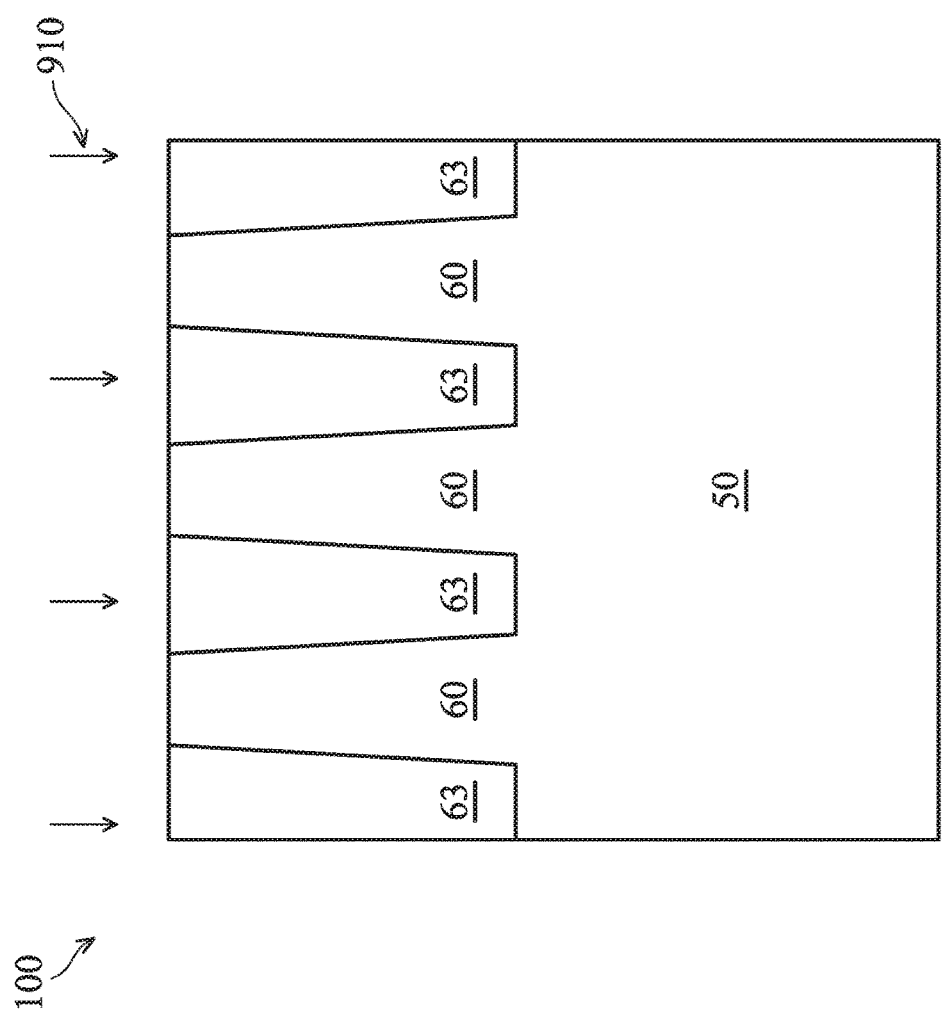

Next, referring to FIG. 9, an anneal process 910 is performed to the FinFET 100. The anneal process 910 further converts the un-converted bonds (e.g., O—Si—OH bonds) into O—Si—O bonds, thus improving the physical properties (e.g., WER, and/or hardness) of the insulation material 63, in some embodiments. The anneal process 910 is a steam anneal process, in an exemplary embodiment. The anneal process 910 may be performed in an anneal chamber different from the deposition chamber or UV curing chamber. In an exemplary embodiment, a steam anneal process 910 is performed at a temperature from about 350° C. to about 450° C. A time interval for the steam anneal process 910 is between about 30 minutes to about 120 minutes, in various embodiments, although other values are also possible.

After the UV curing process 810 and the anneal process 910, the insulation material 63 turns into an oxide (e.g., silicon oxide), thus the insulation material 63 may also be referred to as a dielectric material, or an oxide film. The insulation material 63 has an wet etch rate that is uniform from an upper surface 63U to a lower surface 63L of the insulation material 63, in some embodiments. A ratio between the WER of the insulation material 63 and the WER of a thermal silicon oxide is smaller than about 1.5, in the illustrated embodiment. Note that since the ALD process, the UV curing process and the anneal process are performed at lower temperatures (e.g., less than about 450° C.), the problems discussed above related to high temperature (e.g., higher than about 600° C.) anneal, such as fin bending and loss of CD, are avoided or reduced.

Figure 10:
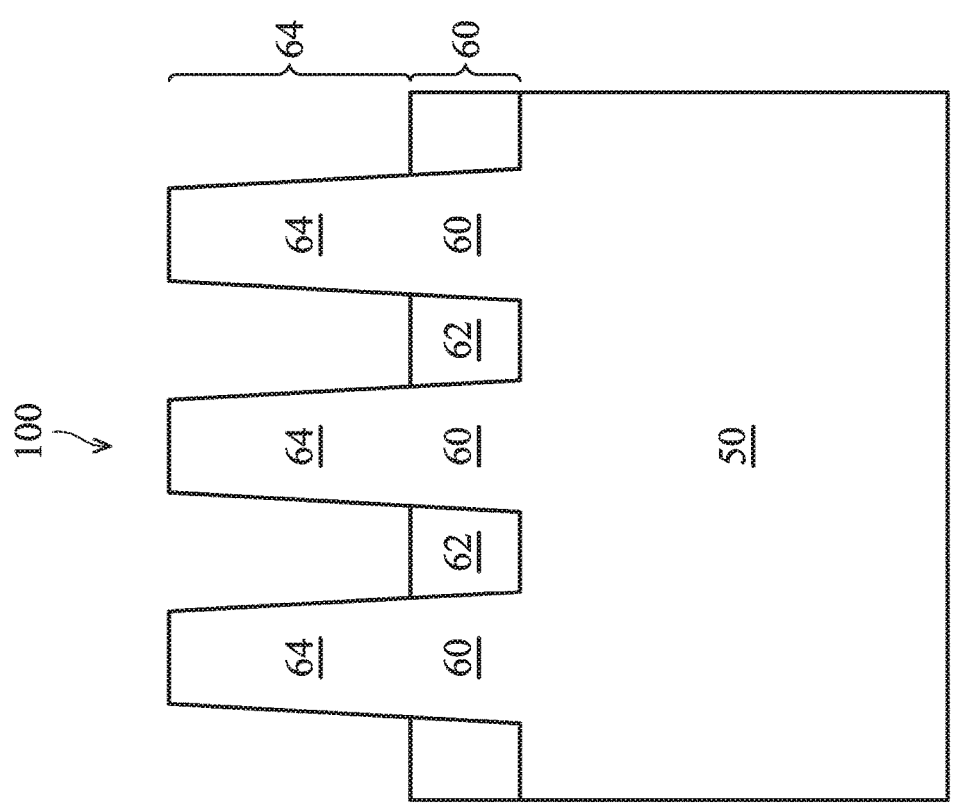

FIG. 10 illustrates the recessing of the insulation material 63, such as to form shallow trench isolation (STI) regions 62 (also referred to as isolation regions 62). The isolation regions 62 are recessed such that the upper portions of the semiconductor strips 60 protrude from between neighboring isolation regions 62 and form semiconductor fins 64. The top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 10 illustrate an embodiment of forming fins 64, but fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 11:
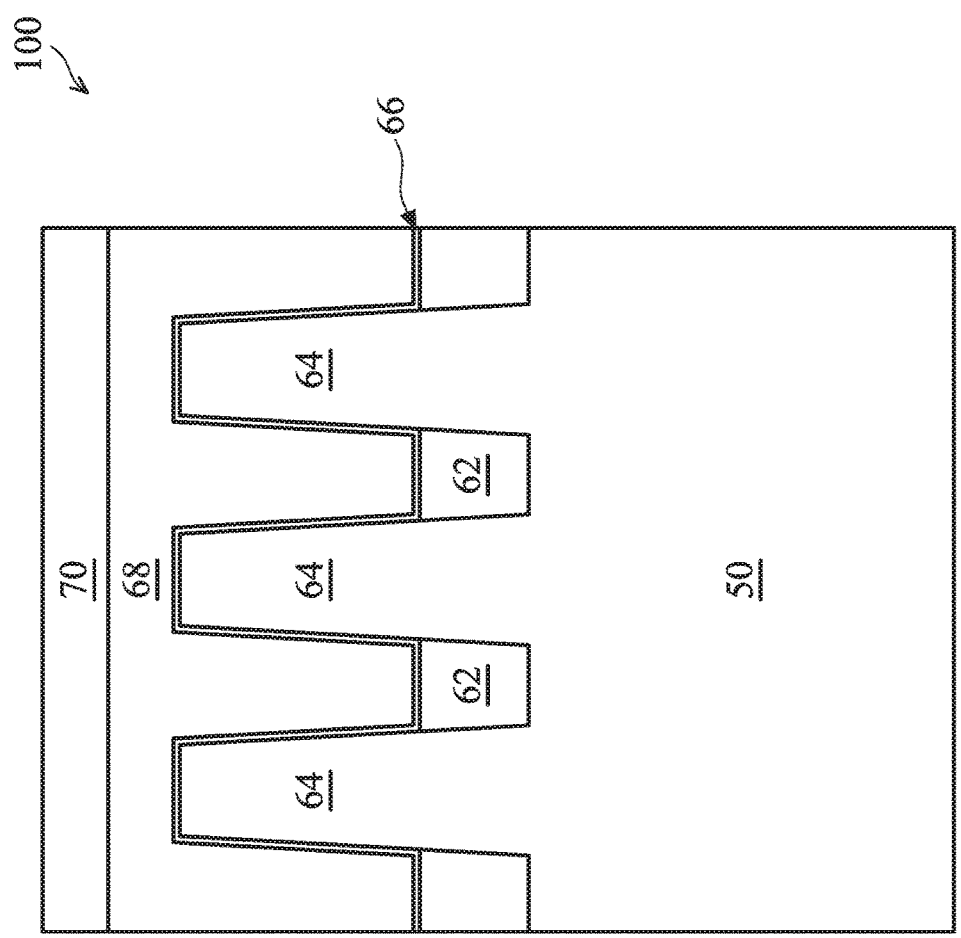

FIG. 11 illustrates the formation of a gate structure over the semiconductor fins 64. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66. The gate 68 and the gate dielectric 66 cover respective channel regions of the semiconductor fins 64. The gate 68 may also have a lengthwise direction substantially perpendicular to the lengthwise direction of respective semiconductor fins 64.

FIGS. 12 and 13 illustrate the cross-section view of the FinFET 100 along line C-C. Referring to FIG. 12, a gate seal spacers 72 (not shown in FIG. 12, see FIG. 14) is formed on exposed surfaces of isolation regions 62, semiconductor fins 64, gate 68, and mask 70. A thermal oxidation or a deposition process may form the gate seal spacers 72. In some embodiments, the gate seal spacers 72 may be formed of a nitride, such as silicon nitride, silicon oxynitride, silicon carbide, silicon carbonitride, the like, or a combination thereof. Portions of the gate seal spacers 72 outside of the sidewalls of the gate structures are then removed. In some embodiments, an anisotropic etch process, such as a dry etch process, may be used to remove portions of the gate seal spacers 72 outside of the sidewalls of the gate structures.

Next, portions of the fins 64 outside of the gate structures are removed by a fin removal process. The gate structures may be used as a mask during the removal of portions of the fins 64. In some embodiments, the removal of the fins 64 outside of the gate structure is a multiple step removal process. In an embodiment, the multiple step removal process includes a first dry etch process and a second wet etch process. In some embodiments, the fins 64 and top portions of the semiconductor strips 60 are removed by the fin removal process, such that a top surface 60T of the remaining portions of the semiconductor strips 60 extends below a top surface 62T of the isolation regions 62, as illustrated in FIG. 12. In other embodiments, bottom portions of the fins 64 remain after the fin removal process, in which case a top surface 64T (illustrated by dashed line 64T in FIG. 12) of the remaining bottom portions of the fins 64 extends above the top surface 62T of the isolation regions 62. To facilitate discussion below, fins 64/60 are used to refer to the remaining portions of the fins 64 and/or the semiconductor strips 60 after the fin removal process.

Next, as illustrated in FIG. 12, source/drain regions 80 are formed over the fins 64/60. The source/drain regions 80 are formed by epitaxially growing a material, such as by metal-organic CVD (MOCVD), molecular beam epitaxy (MBE), liquid phase epitaxy (LPE), vapor phase epitaxy (VPE), selective epitaxial growth (SEG), the like, or a combination thereof.

In the example of FIG. 12, the source/drain regions 80 for adjacent fins 64/60 do not merge together and remain separate source/drain regions 80. In other embodiments, as illustrated in FIG. 13, due to the blocking of the isolation regions 62 between the adjacent fins 64/60, source/drain regions 80 are first grown vertically in the recesses (e.g., recess caused by the fin removal process) over fins 64/60, during which time the source/drain regions 80 do not grow horizontally. After the recesses are fully filled, the source/drain regions 80 are grown both vertically and horizontally to form facets. In the illustrated embodiment of FIG. 13, the source/drain regions 80 of the adjacent fins 64/60 merge to form a continuous epitaxial source/drain region 80.

In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity concentration in a range from about 10E19 cm-3 to about 10E21 cm-3. In some embodiments, the epitaxial source/drain regions may be in situ doped during the epitaxial growth process, in which case the implantation process may not be needed.

FIG. 14 illustrates the FinFET 100 along the cross-section A-A of FIG. 1, after the epitaxial source/drain regions 80 are formed. As illustrated in FIG. 14, the epitaxial source/drain regions 80 may have surfaces raised from respective surfaces of the fins 64 (e.g. raised above the non-recessed portions of the fins 64) and may have facets. FIG. 14 further illustrates gate spacers 86 on the gate seal spacers 72 along sidewalls of the gate structure. The gate spacers 86 may be formed by conformally depositing a material and subsequently anisotropically etching the material. The material of the gate spacers 86 may be silicon nitride, SiCN, a combination thereof, or the like. The gate spacers 86 may be formed before or after the epitaxial source/drain regions 80. In some embodiments, dummy gate spacers are formed on the gate seal spacers 72 before the epitaxial process of the epitaxial source/drain regions 80 and the dummy gate spacers are removed and replaced with the gate spacers 86 after the epitaxial source/drain regions 80 are formed.

Subsequent processing of the FinFET device may be performed, such as the formation of one or more interlayer dielectrics and formation of contacts, details of which are not discussed here.

In some embodiments, a gate-last process (sometimes referred to as replacement gate process) may be used. In those embodiments, the gate 68 and the gate dielectric 66 may be considered dummy structures and will be removed and replaced with an active gate and active gate dielectric during subsequent processing.

Figure 16:
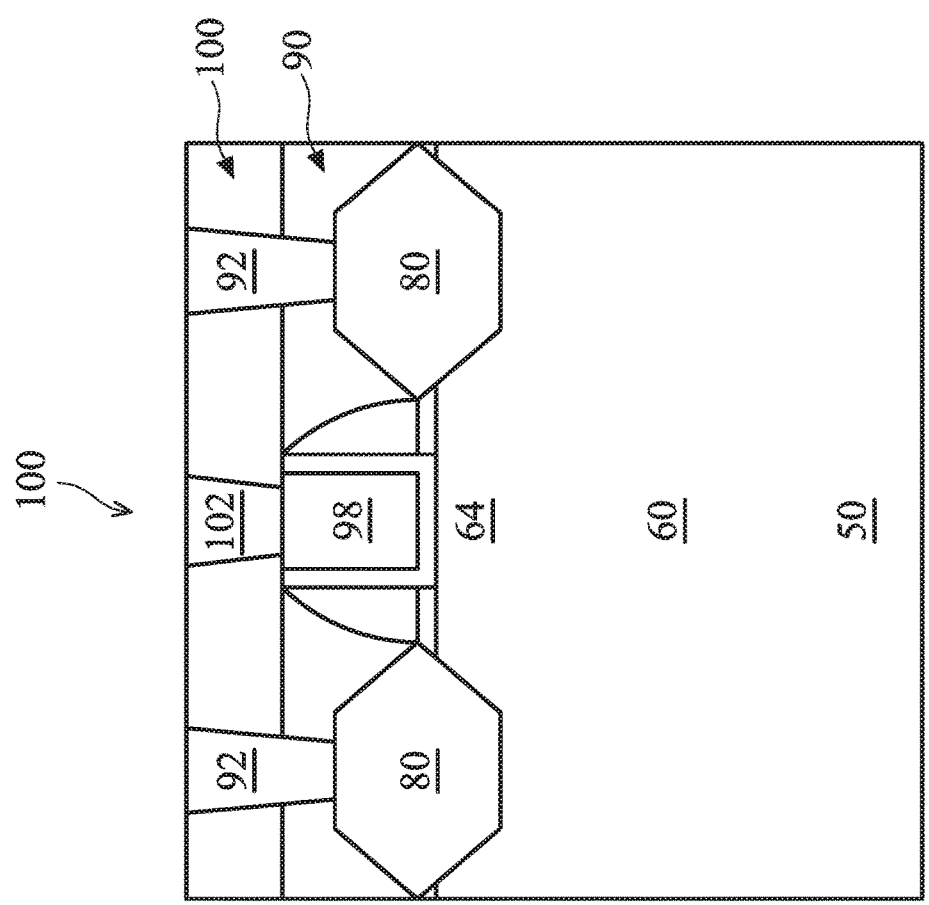

FIGS. 15 and 16 illustrate cross-sectional views of intermediate stages of processing of a gate-last structure in accordance with some embodiments. FIGS. 15 and 16 are cross-sectional views are along the cross-section A-A of FIG. 1.

FIG. 15 illustrates a structure after the processing of FIG. 14 but with additional steps being performed. These additional steps include formation of an interlayer dielectric (ILD) 90 over the structure illustrated in FIG. 14, removing the gate 68 (sometimes referred to as a dummy gate 68 in this embodiment), gate seal spacers 72, and portions of the gate dielectric layer 66 (sometimes referred to as a dummy gate dielectric layer 66 in this embodiment) directly underlying the gate 68.

In some embodiments, the ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

In accordance with some embodiments, the gate 68, the gate dielectric 66, and the gate seal spacers 72 are removed in an etching step(s), so that recesses are formed. Each recess exposes a channel region of a respective fin 64. Each channel region is disposed between neighboring pairs of epitaxial source/drain regions 80. During the removal, the dummy gate dielectric layer 66 may be used as an etch stop layer when the dummy gate 68 is etched. The dummy gate dielectric layer 66 and gate seal spacers 72 may then be removed after the removal of the dummy gate 68.

Further, in FIG. 15, gate dielectric layer 96 and gate electrode 98 are formed for replacement gates. The gate dielectric layer 96 is deposited conformally in the recess, such as on the top surfaces and the sidewalls of the fins 64 and on sidewalls of the gate spacers 86, and on a top surface of the ILD 90. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the gate electrode 98 is deposited over the gate dielectric layer 96, respectively, and fills the remaining portions of the recess. The gate electrode 98 may be made of a metal-containing material such as TiN, TaN, TaC, Co, Ru, Al, combinations thereof, or multi-layers thereof. After the filling of the gate electrode 98, a planarization process, such as a CMP, may be performed to remove the excess portions of gate dielectric layer 96 and the material of gate electrode 98, which excess portions are over the top surface of ILD 90. The resulting remaining portions of material of the gate electrode 98 and the gate dielectric layer 96 thus form a replacement gate of the resulting FinFET.

In FIG. 16, an ILD 100 is deposited over ILD 90. Further illustrated in FIG. 16, contacts 92 are formed through the ILD 100 and the ILD 90 and the contact 102 is formed through the ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for the contacts 92 are formed through the ILDs 90 and 100. The opening for the contact 102 is formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form the contacts 92 and 102 in the openings. An anneal process may be performed to form a silicide at the interface between the epitaxial source/drain regions 80 and the contacts 92, respectively. The contacts 92 are physically and electrically coupled to the epitaxial source/drain regions 80 and the contact 102 is physically and electrically coupled to the gate electrode 98.

Figure 17:
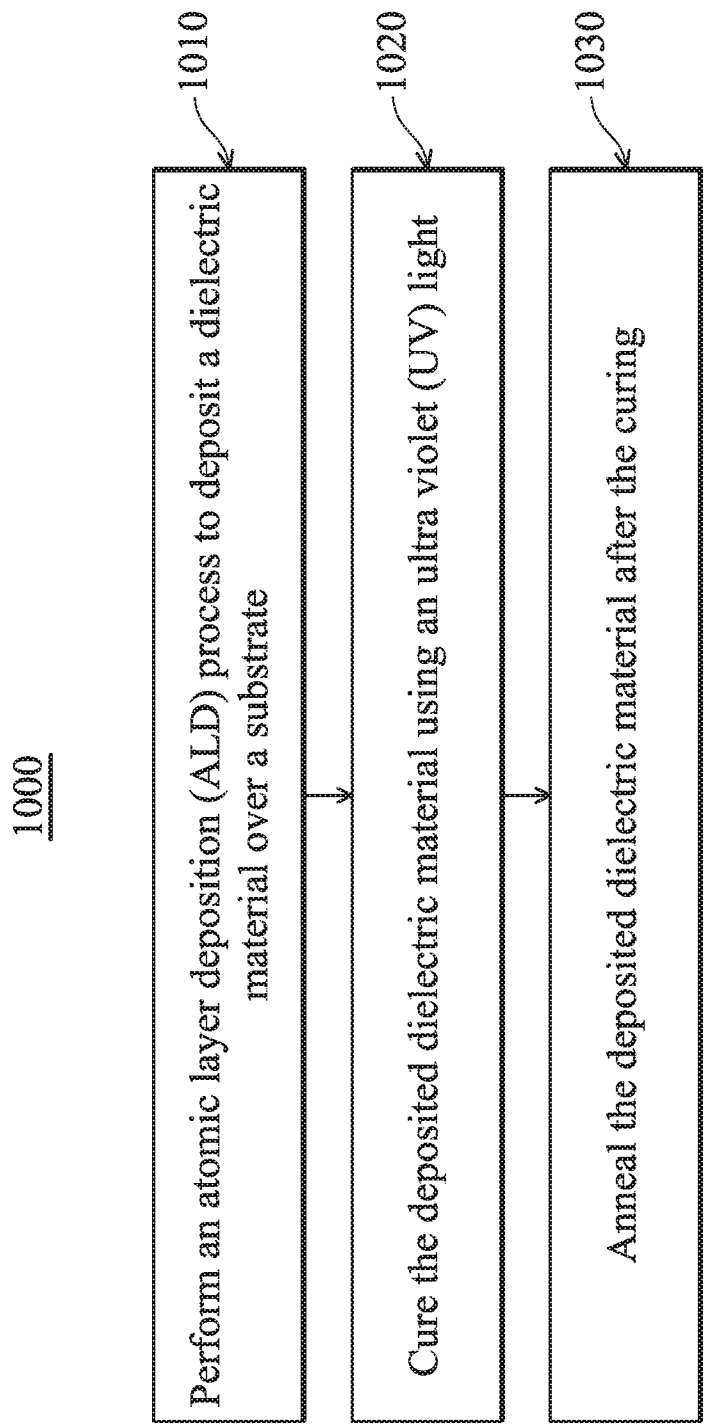
FIG. 17 illustrate a flow chart of a method of fabricating a semiconductor structure, in accordance with some embodiments.

FIG. 17 illustrates a flow chart of a method of fabricating a semiconductor structure, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged and repeated.

Referring to FIG. 17, at step 1010, an atomic layer deposition (ALD) process is performed to deposit a dielectric material over a substrate. At step 1020, the deposited dielectric material is cured using an ultra violet (UV) light. At step 1030, the deposited dielectric material is annealed after the curing.

Embodiments may achieve advantages. The embodiment method disclosed herein uses an ALD deposition process followed by a UV curing process and an anneal process (e.g., a steam anneal process), performed at low temperatures (e.g., less than about 450° C.), to form an insulation material 63. Due to the low temperature processes employed, fin bending and CD loss are avoided or reduced. In addition, the UV curing converts non-converted bonds to O—Si—O bonds, thereby the insulation material 63 does not have weak regions. The insulation material 63 formed by the presently disclosed method has improved physical properties (e.g., low WER, and a uniform WER) for subsequent processing, thus resulting in better semiconductor device performance.

In some embodiments, a method includes performing an atomic layer deposition (ALD) process to deposit a dielectric material over a substrate, curing the deposited dielectric material using an ultra violet (UV) light, and annealing the deposited dielectric material after the curing.

In other embodiments, a method includes filling a recess over a substrate with an insulation material using an atomic layer deposition (ALD) process, and performing a post treatment to reduce an etching rate of the insulation material.

In yet other embodiments, a method of forming a Fin-Field Effect Transistor (FinFET) includes forming a fin protruding above a substrate, and performing an atomic layer deposition (ALD) process to deposit an oxide film in a recess adjacent to the fin. The performing the ALD process includes supplying a gas including a precursor and an oxidant to a deposition chamber having the substrate to form a first layer of the oxide film, removing the gas from the deposition chamber, and performing a plasma process to treat the first layer of the oxide film. The method further includes curing the oxide film using an ultra violet light, and annealing the oxide film using a steam anneal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   performing multiple cycles of an atomic layer deposition (ALD) process, wherein the performing of one cycle includes:
   supplying a gas comprising $SiH_3N(C_3H_7)_2$ and $O_3$ to a deposition chamber having a substrate to deposit a dielectric material over the substrate; and
   supplying an $O_2$ plasma to the deposition chamber after the supplying of the gas;
   curing the deposited dielectric material using an ultra violet (UV) light; and
   annealing the deposited dielectric material after the curing, wherein the annealing comprises a steam anneal process performed at a temperature below about 450° C. and for a time interval greater than about 30 minutes.

2. The method of claim 1, wherein a flow rate of $SiH_3N(C_3H_7)_2$ is between about 50 standard cubic centimeter per minute (sccm) to about 100 sccm, and a flow rate of $O_3$ is between about 4000 sccm to about 8000 sccm.

3. The method of claim 2, wherein the ALD process is performed at a pressure between about 1.5 torr to about 2.2 torr.

4. The method of claim 1, further comprising removing one or more gases from the deposition chamber after the supplying the gas and before the supplying the $O_2$ plasma.

5. The method of claim 1, wherein the UV light has a wavelength between about 200 nm to about 400 nm.

6. The method of claim 5, wherein the curing is performed at a temperature between about 10° C. to about 450° C.

7. The method of claim 6, wherein the curing is performed for a time interval between about 1 minute to about 4 minutes.

8. The method of claim 1, wherein O—Si—O—H bonds are formed at a surface of the substrate when the gas comprising $SiH_3N(C_3H_7)_2$ and $O_3$ is introduced to the deposition chamber due to chemical reactions with the $O_3$.

9. The method of claim 8, wherein the $SiH_3N(C_3H_7)_2$ reacts with the O—Si—O—H bonds to form O—Si—O—SiH₃ bonds through chemisorption, forming a layer of insulation material.

10. The method of claim 9, wherein the $O_3$ reacts with the O—SiH₃ bonds to form O—Si—OH bonds, oxidizing the layer of insulation material.

11. The method of claim 10, wherein the O—Si—OH bonds of the layer of insulation material react with the $O_2$ plasma and forms O—Si—O bonds, turning top portions of the layer of insulation into silicon oxide.

12. The method of claim 1, wherein the deposited dielectric material is formed such that it has a wet etch rate (WER) that is uniform from a top surface of the deposited dielectric material to a bottom surface of the deposited dielectric material.

13. The method of claim 1, wherein the steam anneal process is performed for a time interval between about 30 minutes to about 120 minutes.

14. A method comprising:
   filling a recess over a substrate with an insulation material using an atomic layer deposition (ALD) process comprising a first deposition cycle including:
   forming a first layer of the insulation material using a gas comprising $SiH_3N(C_3H_7)_2$ and $O_3$; and
   treating the first layer using an $O_2$ plasma;
   and performing a post treatment to reduce an etching rate of the insulation material, wherein the performing the post treatment comprises:
   curing the insulation material using an ultra violet (UV) light; and
   performing a steam anneal process over a time interval greater than about 30 minutes at temperatures below about 450° C. to the insulation material after the curing.

15. The method of claim 14, wherein the ALD process further comprises a second deposition cycle after the first deposition cycle, wherein the second deposition cycle forms a second layer of the insulation material over the first layer of the insulation material.

16. The method of claim 14, wherein the curing process is performed at temperatures below about 450° C.

17. A method of forming a Fin-Field Effect Transistor (FinFET) comprising:
   forming a fin protruding above a substrate;
   performing multiple cycles of an atomic layer deposition (ALD) process to deposit an oxide film in a recess adjacent to the fin, wherein the performing of one cycle of the ALD process comprises:
   supplying a gas comprising a precursor $SiH_3N(C_3H_7)_2$ and an oxidant $O_3$ to a deposition chamber having the substrate to form a first layer of the oxide film;
   removing the gas from the deposition chamber; and
   performing a plasma process using an $O_2$ plasma to treat the first layer of the oxide film;
   curing the oxide film using an ultra violet light; and
   annealing the oxide film using a steam anneal process performed at a temperature between about 350° C. and about 450° C. over a time interval greater than about 30 minutes.

18. The method of claim 17, wherein the curing is performed at temperatures lower than about 450° C.

19. The method of claim 17, wherein the plasma process is performed with a flow rate of $O_2$ plasma between about 50 sccm to about 100 sccm and a pressure of about 1.5 torr to about 2.2 torr.

20. The method of claim 17, wherein the plasma process is performed with a temperature between about 350° C. and about 450° C.

* * * * *